(12) United States Patent
Kubota et al.

(10) Patent No.: US 7,269,767 B2
(45) Date of Patent: Sep. 11, 2007

(54) MAGNETIC DISK APPARATUS, PREVENTIVE MAINTENANCE DETECTION METHOD AND PROGRAM THEREFOR

(75) Inventors: Norihide Kubota, Kawasaki (JP); Hideo Takahashi, Kawasaki (JP); Hiroaki Ochi, Kawasaki (JP); Yoshihito Konta, Kawasaki (JP); Yasutake Sato, Kawasaki (JP); Tsukasa Makino, Kawasaki (JP); Mikio Ito, Kawasaki (JP); Hidejirou Daikokuya, Kawasaki (JP); Kazuhiko Ikeuchi, Kawasaki (JP); Shinya Mochizuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 206 days.

(21) Appl. No.: 11/214,941

(22) Filed: Aug. 31, 2005

(65) Prior Publication Data

US 2006/0277451 A1 Dec. 7, 2006

(30) Foreign Application Priority Data

Jun. 6, 2005 (JP) .............................. 2005-164990

(51) Int. Cl.
- G11C 29/00 (2006.01)
- G01R 31/28 (2006.01)
- G11B 20/00 (2006.01)
- G11B 11/00 (2006.01)
- G11B 27/36 (2006.01)
- G11B 5/09 (2006.01)

(52) U.S. Cl. .................... 714/718; 714/738; 369/53.1; 369/53.15; 360/31; 360/53

(58) Field of Classification Search .................... None
See application file for complete search history.

(56) References Cited

U.S. PATENT DOCUMENTS

| | | | | |
|---|---|---|---|---|
| 4,733,305 A | * | 3/1988 | Miura et al. | 358/401 |
| 5,017,141 A | * | 5/1991 | Relf et al. | 434/29 |
| 6,553,454 B1 | * | 4/2003 | Harada | 711/111 |
| 7,177,883 B2 | * | 2/2007 | Yagawa | 707/104.1 |

FOREIGN PATENT DOCUMENTS

| | | |
|---|---|---|
| JP | 6-223428 | 8/1994 |
| JP | 9-16340 | 1/1997 |
| WO | 97/27530 | 7/1997 |

* cited by examiner

*Primary Examiner*—Phung My Chung
(74) *Attorney, Agent, or Firm*—Staas & Halsey LLP

(57) ABSTRACT

The present invention has been made to obtain a magnetic disk apparatus and the like capable of using a patrol region in the magnetic disk to detect a location in need of maintenance in hardware equipment around the magnetic disk in a separate manner from the disk itself and thereby avoiding useless replacement and operating the magnetic disk apparatus at low cost. In a preventive maintenance detection for a magnetic disk apparatus having a patrol function that uses a patrol region in the magnetic disk to determine the presence/absence of the need of preventive maintenance, a data pattern for detecting crosstalk in hardware equipment around the disk is generated, a write command or read command corresponding to the generated data pattern is executed, and the crosstalk is determined/detected based on the command execution result.

15 Claims, 2 Drawing Sheets

MAGNETIC DISK APPARATUS, PREVENTIVE MAINTENANCE DETECTION METHOD AND PROGRAM THEREFOR

BACKGROUND OF THE INVENTION

1. Field of the Invention

The present invention relates to a magnetic disk apparatus having a patrol function that uses a patrol region in the disk to determine the presence/absence of the need of preventive maintenance on the disk and peripheral hardware and a preventive maintenance detection method and program therefor.

2. Description of the Related Art

Conventionally, a magnetic disk apparatus having a patrol function that uses a patrol region in the disk to determine the presence/absence of the need of preventive maintenance on the magnetic disk apparatus has been known. The patrol function compares the number of retries of writing/reading operations for the magnetic disk unit with previously set frequency condition to determine a failure sign and automatically performs a change of an operating magnetic disk unit for a spare magnetic disk unit (refer to, for example, Jpn. Pat. Appln. Laid-Open Publication No. 9-16340).

However, the patrol function of the above conventional magnetic disk apparatus uses only one writing/reading data pattern, so that, although the location in need of maintenance in the disk itself can be detected in the early stages, it is impossible to detect the location in need of maintenance in hardware equipment, such as an FC (fiber channel), around the disk in a separate manner from the disk. Therefore, in the event of a replacement, it is necessary to replace them as a unit, resulting in waste and added cost.

SUMMARY OF THE INVENTION

The present invention has been made to solve the above problem, and an object thereof is to provide a magnetic disk apparatus capable of using a patrol region in the disk to detect a location in need of maintenance in hardware equipment around the magnetic disk in a separate manner from the disk itself and thereby avoiding useless replacement and operating the magnetic disk apparatus at low cost, and a preventive maintenance detection method and program therefor.

To solve the above problem, according to a first aspect of the present invention, there is provided a magnetic disk apparatus having a patrol function that uses a patrol region in the disk to determine the presence/absence of the need of preventive maintenance, comprising: a data pattern generation section that generates a data pattern for detecting crosstalk in hardware equipment around the disk; a command execution section that executes a write command or read command corresponding to the data pattern generated by the data pattern generation section; and a crosstalk determination/detection section that determines/detects the crosstalk based on the command execution result obtained by the command execution section.

In the magnetic disk apparatus according to the present invention, the data pattern generation section generates, as the crosstalk detection data, a plurality of data patterns corresponding to a plurality of detection targets.

The command execution section executes a command of the plurality of data patterns corresponding to the plurality of detection targets every predetermined time period. The data pattern generation section generates crosstalk detection data patterns for at least one of a DA (device adapter) board, an FC cable, a disk as the detection target.

The magnetic disk apparatus according to the present invention further comprises a setting section that can set the crosstalk detection data pattern.

According to a second aspect of the present invention, there is provided a preventive maintenance detection method for a magnetic disk apparatus having a patrol function that uses a patrol region in the disk to determine the presence/absence of the need of preventive maintenance, comprising: a data pattern generation step that generates a data pattern for detecting crosstalk in hardware equipment around the disk; a command execution step that executes a write command or read command corresponding to the data pattern generated by the data pattern generation step; and a crosstalk determination/detection step that determines/detects the crosstalk based on the command execution result obtained by the command execution step.

According to a third aspect of the present invention, there is provided a preventive maintenance detection program allowing a computer in the magnetic disk apparatus to execute a preventive maintenance detection method for a magnetic disk apparatus having a patrol function that uses a patrol region in the disk to determine the presence/absence of the need of preventive maintenance, the program allowing the computer to execute: a data pattern generation step that generates a data pattern for detecting crosstalk in hardware equipment around the disk; a command execution step that executes a write command or read command corresponding to the data pattern generated by the data pattern generation step; and a crosstalk determination/detection step that determines/detects the crosstalk based on the command execution result obtained by the command execution step.

In the preventive maintenance detection program for a magnetic disk apparatus according to the present invention, the data pattern generation step generates, as the crosstalk detection data, a plurality of data patterns corresponding to a plurality of detection targets.

In the preventive maintenance detection program for a magnetic disk apparatus according to the present invention, the command execution step executes a command of the plurality of data patterns corresponding to the plurality of detection targets every predetermined time period. The data pattern generation step generates crosstalk detection data patterns for at least one of a DA (device adapter) board, an FC cable, a disk as the detection target.

The preventive maintenance detection program for a magnetic disk apparatus according to the present invention further allows the computer to execute a setting step that can set the crosstalk detection data pattern before the data pattern generation step.

As described above, according to the present invention, it is possible to detect a location in need of maintenance in hardware equipment around the magnetic disk in a separate manner from the disk itself, thereby avoiding useless replacement and operating the magnetic disk apparatus at low cost.

DETAILED DESCRIPTION OF THE PREFERRED EMBODIMENTS

An embodiment of the present invention will be described below with reference to the accompanying drawings.

Figure 1:
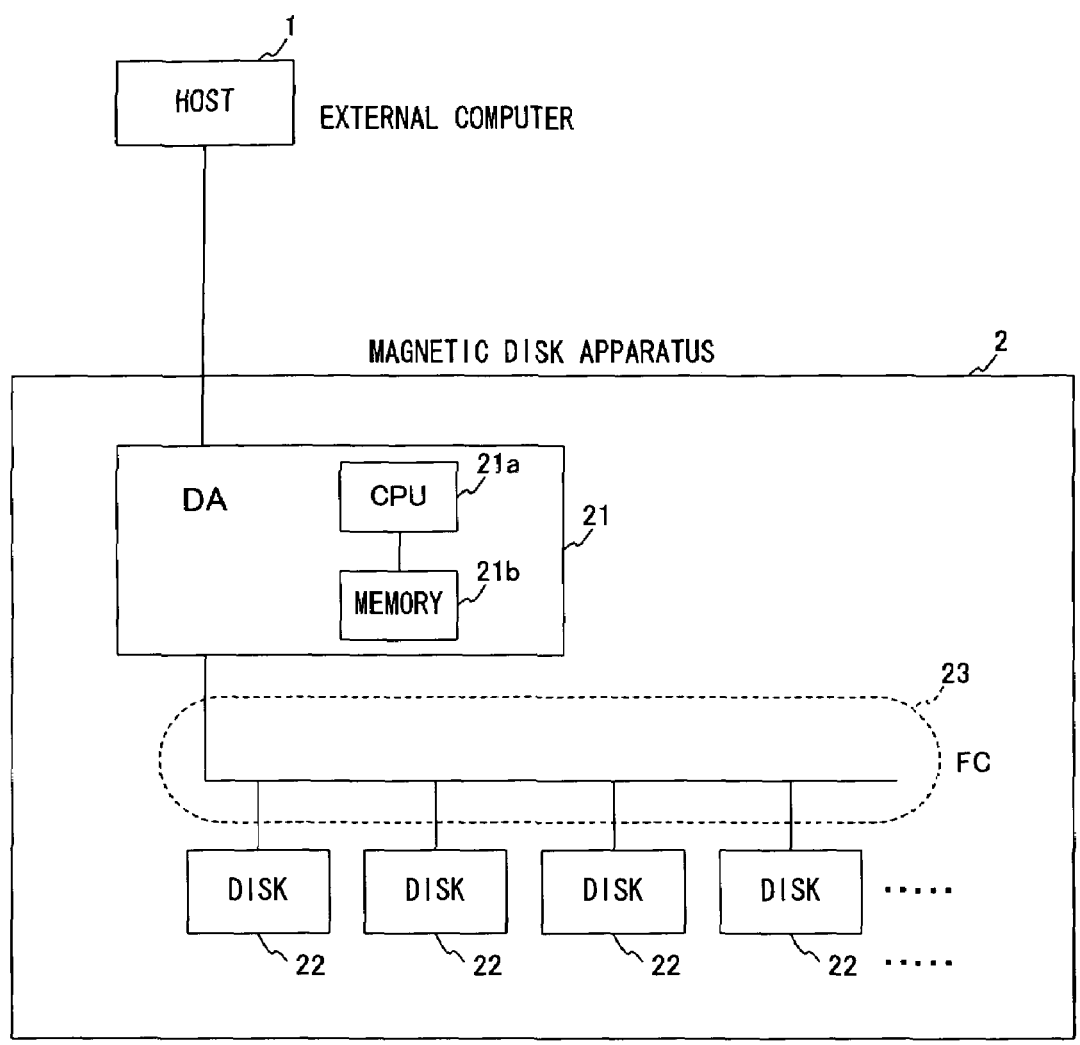
FIG. 1 is a block diagram showing an embodiment of the present invention.

FIG. 1 is a block diagram showing an embodiment of the present invention. A magnetic disk apparatus 2 in the present embodiment is connected to a host 1 which is an external computer. The magnetic disk apparatus 2 includes a DA (device adapter) 21, an FC (fiber channel) 23 connected to the DA 21, and a plurality of disks 22 connected to the FC 23. The DA 21 includes a CPU 21a and a memory 21b. The DA 21 constitutes a data pattern generation section, a command execution section, and a crosstalk determination/detection section.

In the embodiment of the present invention, in a magnetic disk apparatus having a patrol function, a data pattern that can detect crosstalks of individual hardware is adopted as a data pattern for use in a write/read test in place of a conventional simple data pattern to thereby detect hardware deterioration in the early stages in a separate manner from the disk.

The "crosstalk" denotes a phenomenon in which unnecessary signals leak into a circuit or line due to influence of stray capacitance, parasitic capacitance, common impedance of the ground line, and the like, or the ratio thereof. In some cases, occurrence of the crosstalk allows the output of a nonoperating gate to be affected by an operating gate in a logic IC having a plurality of gates.

In the present embodiment, the hardware equipment around the disks, which are targets of crosstalk detection, includes a DA board serving as an FC transmission path and an FC path (FC cable). Data patterns for detecting the crosstalks of these components are separately used from a data pattern for detecting the crosstalk of the disk.

Each of the data patterns is obtained by experimentally defining a pattern in which the crosstalk of target hardware is easy to be detected. The data patterns thus experimentally defined are stored in the memory 21b as the data pattern for detecting the crosstalk of target hardware. The crosstalk detection data pattern is generated when the data pattern generation section reads out the stored data pattern.

It is possible to set, in the memory 21b, the hardware equipment in the magnetic disk apparatus (DA board, FC path, or disk) whose crosstalk is to be detected. In this case, a crosstalk detection data pattern corresponding to the hardware set in the memory 21b is adequately generated.

In this case, since the crosstalk detection data patterns differ from each other, the targets of the respective data patterns are changed every predetermined time period (1 hour, for example) in the read/write test of the disk patrol.

For example, a crosstalk detection data pattern for the DA board is generated to perform the test at the time when the power of the magnetic disk apparatus is turned ON; a crosstalk detection data pattern for the FC cable is generated to perform the test an hour later; and a crosstalk detection data pattern for the disk is generated to perform the test another hour later.

As describe above, it has become possible to perform diagnosis of the hardware around the disk while performing diagnosis of the media using the read/write test in the same manner as the conventional case, and an error detected location is separated off using a statistical method based on the data of the past, thereby increasing detection capability of the disk patrol function for the location in need of preventive maintenance.

In the case where a maintenance PC (personal computer) exists, the maintenance PC is used to set the test data (data pattern) used in the write/read time for the memory 21b and to set or specify the hardware to be checked intensively by the patrol function or data pattern to be used, thereby performing flexible patrol in the case where a hardware configuration is modified. It is assumed that such a setting step has been made as a preliminary step toward the following processing operation.

Hereinafter, the entire operation of the DA in the embodiment of the present invention will be described with reference to the flowchart of FIG. 2.

Firstly, a data pattern to be used in performing a read/write test is selected (S1). This selection is made from among the crosstalk detection data pattern for the FC cable, crosstalk detection data pattern for the disk, and crosstalk detection data pattern for the DA board, based on the abovementioned time point or time interval.

When it is determined that the crosstalk detection data pattern for the FC cable is used, the crosstalk detection data pattern for the FC cable is generated (read out from the memory: data pattern generation step S2) and a write command thereof is issued to the disk (command execution step: S5).

Similarly, in the case where it is determined, in the selection operation in step S1, that the crosstalk detection data pattern for the disk or crosstalk detection data pattern for the DA board is used, the crosstalk detection data pattern for the disk or for the DA board is generated (S3, S4) and a write command is issued to the disk (S5).

Next, the presence/absence of the error in the write command issuance process in step S5 is determined (S6). When it is determined that an error exists, the content of the error (data pattern that has been used) is determined (crosstalk detection determination step: S7).

In the case where it is determined, in the determination of the error content in step S7, that the error is for the crosstalk detection data pattern for the FC cable or DA board, the DA 21 determines that preventive maintenance is required and issues an instruction to perform preventive maintenance for the error location (S8). In this case, it is possible to separate off the suspect location using a statistical method and prompt a user to perform a preventive replacement.

In the case where it is determined, in the determination of the error content in step S7, that the error is for the crosstalk detection data pattern for the disk, an instruction to perform preventive maintenance is issued in order to recover the disk medium error (S9).

On the other hand, in the case where it is determined, in the determination in step S6, that an error does not exist in the write command issuance process in step S5, a read command corresponding to the same data pattern is issued to the disk (command execution step: S10).

Then, the presence/absence of the error in the read command issuance process is determined (S11). In the case where an error exists, the content of the error is determined (crosstalk detection determination step: S12) as in the case of step S7. In the case where it is determined that the error is for the crosstalk detection data pattern for the FC cable or DA board, an instruction to perform preventive maintenance for the FC cable or DA board is issued (S13).

In the case where it is determined, in the determination of the error content in step S12, that the error is for the crosstalk detection data pattern for the disk, an instruction to perform preventive maintenance is issued in order to recover the disk medium error (S14).

In the case where it is determined, in the determination in step S11, that an error does not exist in the read command issuance process, the process is suspended until the next operation is started.

While the embodiment of the present invention has been described, the present invention is not limited to the above embodiment. It goes without saying that the target of the crosstalk detection described above includes other hardware in the FC transmission path.

Figure 2:
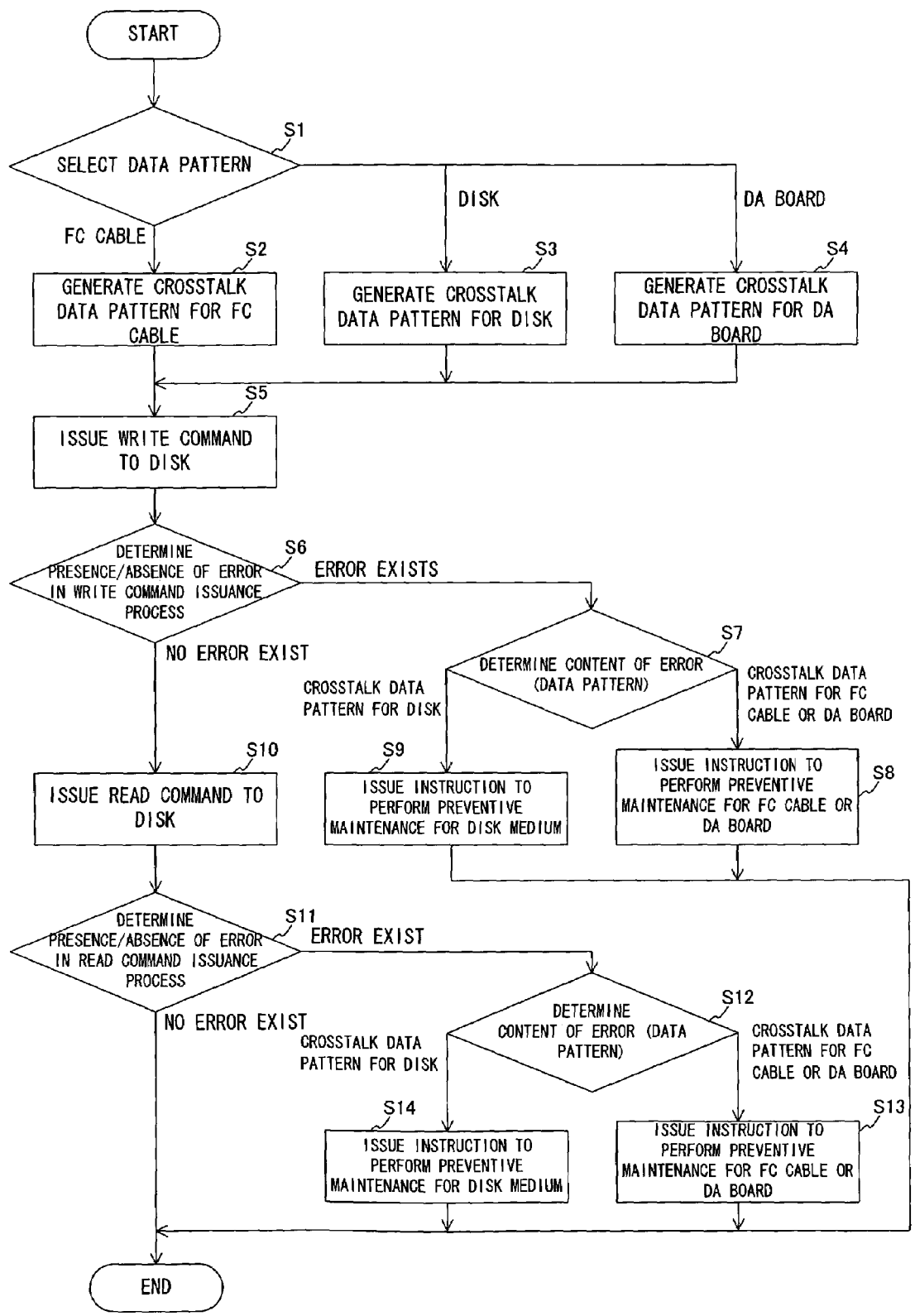
FIG. 2 is a flowchart showing an operation according to the present invention.

An execution of the operation described in FIG. 2 by the computer 21a of the DA 21 provides a preventive maintenance detection program of the present invention. When the program is stored in a computer-readable storage medium (memory 21b, for example), it is possible for the computer 21a to execute the program. The computer-readable medium mentioned here includes: a portable storage medium such as a CD-ROM, a flexible disk, a DVD disk, a magneto-optical disk, or an IC card; a database that holds computer program; another computer and database thereof; and a transmission medium on a network line.

What is claimed is:

1. A magnetic disk apparatus having a patrol function that uses a patrol region in the disk to determine the presence/absence of the need of preventive maintenance, comprising:
    a data pattern generation section that generates a data pattern for detecting crosstalk in hardware equipment around the disk;
    a command execution section that executes a write command or read command corresponding to the data pattern generated by the data pattern generation section; and
    a crosstalk determination/detection section that determines/detects the crosstalk based on the command execution result obtained by the command execution section.

2. The magnetic disk apparatus according to claim 1, wherein
    the data pattern generation section generates, as the crosstalk detection data, a plurality of data patterns corresponding to a plurality of detection targets.

3. The magnetic disk apparatus according to claim 2, wherein
    the command execution section executes a command of the plurality of data patterns corresponding to the plurality of detection targets every predetermined time period.

4. The magnetic disk apparatus according to claim 2, wherein
    the data pattern generation section generates crosstalk detection data patterns for at least one of a DA (device adapter) board, an FC cable, a disk as the detection target.

5. The magnetic disk apparatus according to claim 1, further comprising a setting section that can set the crosstalk detection data pattern.

6. A preventive maintenance detection method for a magnetic disk apparatus having a patrol function that uses a patrol region in the disk to determine the presence/absence of the need of preventive maintenance, comprising:
    a data pattern generation step that generates a data pattern for detecting crosstalk in hardware equipment around the disk;
    a command execution step that executes a write command or read command corresponding to the data pattern generated by the data pattern generation step; and
    a crosstalk determination/detection step that determines/detects the crosstalk based on the command execution result obtained by the command execution step.

7. The preventive maintenance detection method for a magnetic disk apparatus according to claim 6, wherein
    the data pattern generation step generates, as the crosstalk detection data, a plurality of data patterns corresponding to a plurality of detection targets.

8. The preventive maintenance detection method for a magnetic disk apparatus according to claim 7, wherein the command execution step executes a command of the plurality of data patterns corresponding to the plurality of detection targets every predetermined time period.

9. The preventive maintenance detection method for a magnetic disk apparatus according to claim 7, wherein the data pattern generation step generates crosstalk detection data patterns for at least one of a DA (device adapter) board, an FC cable, a disk as the detection target.

10. The preventive maintenance detection method for a magnetic disk apparatus according to claim 6, further comprising a setting step that can set the crosstalk detection data pattern before the data pattern generation step.

11. A preventive maintenance detection program allowing a computer in the magnetic disk apparatus to execute a preventive maintenance detection method for a magnetic disk apparatus having a patrol function that uses a patrol region in the disk to determine the presence/absence of the need of preventive maintenance, the program allowing the computer to execute:
    a data pattern generation step that generates a data pattern for detecting crosstalk in hardware equipment around the disk;
    a command execution step that executes a write command or read command corresponding to the data pattern generated by the data pattern generation step; and
    a crosstalk determination/detection step that determines/detects the crosstalk based on the command execution result obtained by the command execution step.

12. The preventive maintenance detection program for a magnetic disk apparatus according to claim 11, wherein
    the data pattern generation step generates, as the crosstalk detection data, a plurality of data patterns corresponding to a plurality of detection targets.

13. The preventive maintenance detection program for a magnetic disk apparatus according to claim 12, wherein
    the command execution step executes a command of the plurality of data patterns corresponding to the plurality of detection targets every predetermined time period.

14. The preventive maintenance detection program for a magnetic disk apparatus according to claim 12, wherein
    the data pattern generation step generates crosstalk detection data patterns for at least one of a DA (device adapter) board, an FC cable, a disk as the detection target.

15. The preventive maintenance detection program for a magnetic disk apparatus according to claim 11, further allowing the computer to execute a setting step that can set the crosstalk detection data pattern before the data pattern generation step.

* * * * *